(12) United States Patent
Katagiri (10) Patent No.: US 11,015,239 B2
(45) Date of Patent: May 25, 2021

(54) COATED CUTTING TOOL (71) Applicant: TUNGALOY CORPORATION, Fukushima (JP)

(72) Inventor: Takao Katagiri, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 28 days.

(21) Appl. No.: 16/564,228

(22) Filed: Sep. 9, 2019

(65) Prior Publication Data
US 2020/0080187 A1 Mar. 12, 2020

(30) Foreign Application Priority Data
Sep. 11, 2018 (JP) .............. JP2018-169819

(51) Int. Cl.
*B23B 27/14* (2006.01)
*C23C 14/06* (2006.01)
(Continued)

(52) U.S. Cl.
CPC .......... *C23C 14/0641* (2013.01); *C23C 14/30* (2013.01); *B23B 27/14* (2013.01);
(Continued)

(58) Field of Classification Search
CPC ........ B23B 27/14; C23C 5/16; C23C 14/0641
(Continued)

(56) References Cited

U.S. PATENT DOCUMENTS 8,318,328 B2 * 11/2012 Endrino .............. C23C 14/0664
428/697
10,184,187 B2 1/2019 Kumar et al.
(Continued)

FOREIGN PATENT DOCUMENTS

CA 2 523 882 * 7/2004
CN 104662195 A 5/2015
(Continued)

OTHER PUBLICATIONS

A.E. Reiter et al., "Investigation of the properties of Al1-xCrxN coatings prepared by cathodic arc evaporation", Surface & Coatings Technology, pp. 2114-2122, Apr. 2005, Liechtenstein, Austria.

*Primary Examiner* — Archene A Turner
(74) *Attorney, Agent, or Firm* — Studebaker & Brackett PC (57) ABSTRACT

A coated cutting tool comprising a substrate and a coating layer formed on the substrate, wherein: the coating layer includes a first composite nitride layer containing a compound having a composition represented by $(Al_xCr_{1-x})N$, and a second composite nitride layer containing a compound having a composition represented by $(Al_yCr_{1-y})N$; an average particle size of particles which constitute of the first composite nitride layer is less than 100 nm; the second composite nitride layer comprises a cubic crystal system, and a ratio I(111)/I(200) of a peak intensity I(111) for a (111) plane to a peak intensity I(200) for a (200) plane in the second composite nitride layer is 1.0 or more; an average particle size of particles which constitute of the second composite nitride layer is 100 nm or more; and a residual stress of the second composite nitride layer is from −10.0 GPa or higher to −2.0 GPa or lower.

20 Claims, 1 Drawing Sheet

(51) Int. Cl.
    *C23C 14/30*      (2006.01)
    *B23C 5/16*       (2006.01)
    *B32B 15/04*      (2006.01)

(52) U.S. Cl.
    CPC .............. *B23C 5/16* (2013.01); *B32B 15/04* (2013.01); *B32B 2250/03* (2013.01); *B32B 2255/28* (2013.01)

(58) Field of Classification Search
    USPC .......... 51/307, 309; 428/336, 597, 698, 699, 428/697
    See application file for complete search history.

(56) References Cited

U.S. PATENT DOCUMENTS

| | | |
|---|---|---|
| 2005/0170162 A1 | 8/2005 | Yamamoto et al. |
| 2015/0030401 A1 | 1/2015 | Senbokuya et al. |
| 2015/0050490 A1* | 2/2015 | Kumar ................ C23C 14/0021 428/336 |
| 2015/0232978 A1 | 8/2015 | Schier |
| 2016/0040283 A1 | 2/2016 | Ogami et al. |

FOREIGN PATENT DOCUMENTS

| | | |
|---|---|---|
| DE | 10 2005 063 421 B4 | 9/2010 |
| DE | 10 2014 109 942 A1 | 3/2015 |
| JP | 2010-094744 A | 4/2010 |
| JP | 2018-003046 A | 1/2018 |

* cited by examiner

COATED CUTTING TOOL

TECHNICAL FIELD

The present invention relates to a coated cutting tool.

BACKGROUND ART

For the cutting of steel, etc., a cutting tool consisting of a cemented carbide or a cubic boron nitride (cBN) sintered body has been widely been employed. Among others, due to its high general versatility, a surface coated cutting tool comprising, on a surface of a cemented carbide substrate, one layer or two or more layers each comprised of a hard coating, such as a TiN layer, a TiAlN layer or an AlCrN layer, has been used for various kinds of machining.

In particular, a surface coated cutting tool with an atomic ratio of Al in AlCrN of 80% or more has a reduced hardness because it contains hexagonal crystals and therefore has reduced wear resistance.

In order to improve the above problem, for example, JP2018-003046 A proposes a hard coating comprised of $Al_{1-x}Cr_xN$ ($0.05 \leq x \leq 0.25$; wherein x denotes an atomic ratio of Cr) containing hexagonal crystals.

SUMMARY

Technical Problem

In recent times in the field of cutting, there has been a trend toward cutting conditions becoming more severe compared with the prior art in order to increase machining efficiency. In conjunction with such trend, a longer tool life than that achieved so far is being demanded. In particular, in machining involving a high cutting temperature, such as high-speed machining or large-load machining, wear is likely to occur due to a reaction between a workpiece and a coating layer.

Meanwhile, the hard coating formation method of JP2018-003046 A involves a high bias voltage, and accordingly involves a high compressive stress of the hard coating, thereby leading to reduced adhesion. Further, due to such high compressive stress, the strength of the hard coating is insufficient in machining involving the application of a high load (in particular, rotating machining), as a result of which cracking is likely to progress in the tool. Moreover, the resulting tool has insufficient fracture resistance, whereby it is difficult to extend the tool life.

The present invention has been made in light of the above circumstances, and an object of the present invention is to provide a coated cutting tool which has improved wear resistance and fracture resistance and which accordingly has a long tool life.

Solution to Problem

The present inventor has conducted studies regarding extending the tool life of a coated cutting tool and has then found that specific configurations of a coated cutting tool allow the wear resistance and fracture resistance thereof to be improved, and found that, as a result, the tool life of the coated cutting tool can be extended, and this has led to the completion of the present invention.

Namely, the gist of the present invention is as set forth below.

[1] A coated cutting tool comprising a substrate and a coating layer formed on the substrate, wherein:

the coating layer includes a first composite nitride layer containing a compound having a composition represented by formula (1) below and a second composite nitride layer containing a compound having a composition represented by formula (2) below:

$$(Al_xCr_{1-x})N \quad (1)$$

wherein x denotes an atomic ratio of the Al element based on a total of the Al element and the Cr element and satisfies $0.75 \leq x \leq 0.90$; and $$(Al_yCr_{1-y})N \quad (2)$$

wherein y denotes an atomic ratio of the Al element based on a total of the Al element and the Cr element and satisfies $0.75 \leq y \leq 0.90$;

an average particle size of particles which constitute of the first composite nitride layer is less than 100 nm;

the second composite nitride layer comprises a cubic crystal system, and a ratio $I(111)/I(200)$ of a peak intensity $I(111)$ for a (111) plane of the second composite nitride layer to a peak intensity $I(200)$ for a (200) plane of the second composite nitride layer in an X-ray diffraction analysis is 1.0 or more;

an average particle size of particles which constitute of the second composite nitride layer is 100 nm or more; and a residual stress of the second composite nitride layer is from $-10.0$ GPa or higher to $-2.0$ GPa or lower.

[2] The coated cutting tool according to [1], wherein an average thickness of the first composite nitride layer is from 0.1 μm or more to 1.0 μm or less.

[3] The coated cutting tool according to [1] or [2], wherein an average thickness of the second composite nitride layer is from 0.5 μm or more to 5.0 μm or less.

[4] The coated cutting tool according to any of [1] to [3], wherein particles which constitute of the second composite nitride layer comprise columnar crystals with an aspect ratio of 2.0 or more.

[5] The coated cutting tool according to any of [1] to [4], wherein the coating layer has an alternating laminate structure in which the first composite nitride layer and the second composite nitride layer are repeatedly formed twice or more in an alternating manner.

[6] The coated cutting tool according to any of [1] to [5], wherein an average thickness of the entire coating layer is from 1.0 μm or more to 6.0 μm or less.

[7] The coated cutting tool according to any of [1] to [6], wherein the substrate is a cemented carbide, cermet, ceramic or a cubic boron nitride sintered body.

Advantageous Effects of Invention

The present invention can provide a coated cutting tool which has improved wear resistance and fracture resistance, and which accordingly has a long tool life.

BRIEF DESCRIPTION OF DRAWINGS

The FIGURE is a schematic view showing an example of a coated cutting tool according to the present invention.

DESCRIPTION OF EMBODIMENTS

Figure 1:
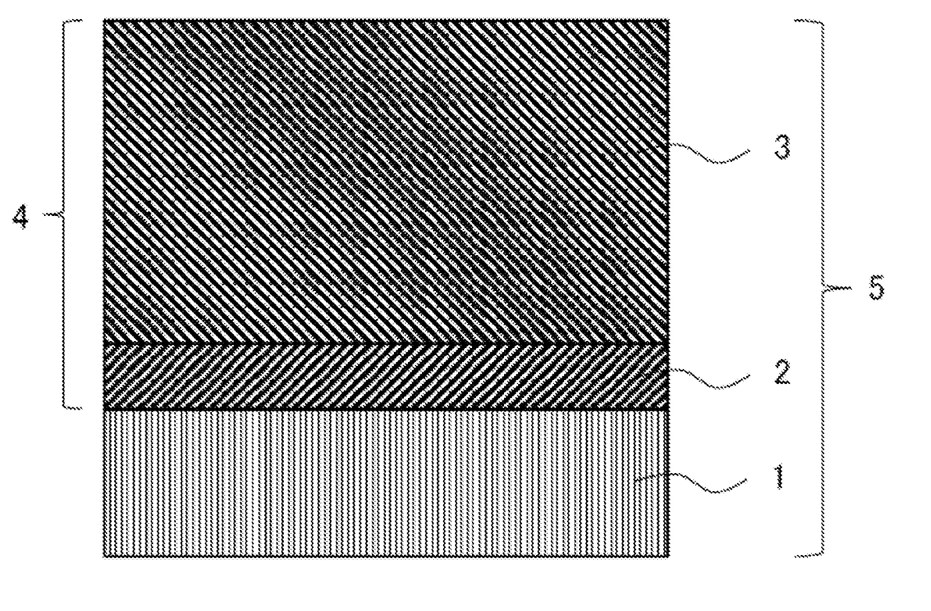

An embodiment for carrying out the present invention (hereinafter simply referred to as the "present embodiment") will hereinafter be described in detail; however, the present invention is not limited to the present embodiment below. Various modifications may be made to the present invention without departing from the gist of the invention. It should be noted that, in the drawings, the same elements are denoted by the same symbols and will not be further explained. Unless otherwise specified, positional relationships, such as vertical and horizontal relationships, are based on the positional relationships shown in the drawings. Further, the dimensional ratios of the drawings are not limited to those shown therein.

A coated cutting tool according to the present embodiment is a coated cutting tool comprising a substrate and a coating layer formed on the substrate, wherein:

the coating layer includes a first composite nitride layer containing a compound having a composition represented by formula (1) below (hereinafter also simply referred to as the "first composite nitride layer") and a second composite nitride layer containing a compound having a composition represented by formula (2) below (hereinafter also simply referred to as the "second composite nitride layer"):

$$(Al_xCr_{1-x})N \quad (1)$$

wherein x denotes an atomic ratio of the Al element based on a total of the Al element and the Cr element and satisfies $0.75 \leq x \leq 0.90$; and $$(Al_yCr_{1-y})N \quad (2)$$

wherein y denotes an atomic ratio of the Al element based on a total of the Al element and the Cr element and satisfies $0.75 \leq y \leq 0.90$;

an average particle size of particles which constitute of the first composite nitride layer is less than 100 nm;

the second composite nitride layer comprises a cubic crystal system, and a ratio I(111)/I(200) of a peak intensity I(111) for a (111) plane of the second composite nitride layer to a peak intensity I(200) for a (200) plane of the second composite nitride layer in an X-ray diffraction analysis is 1.0 or more;

an average particle size of particles which constitute of the second composite nitride layer is 100 nm or more; and a residual stress of the second composite nitride layer is from −10.0 GPa or higher to −2.0 GPa or lower.

The details of the factors for the above-described coated cutting tool having improved wear resistance and fracture resistance and thereby having a long tool life have not been clarified. The present inventor considers such factors to be as set forth below; however, the factors are not limited thereto. Namely, with regard to the first composite nitride layer which constitutes the coating layer, if x of the composition $(Al_xCr_{1-x})N$ of the compound contained in such first composite nitride layer is from 0.75 or more to 0.90 or less, this leads to excellent adhesion with the second composite nitride layer, thereby resulting in the coated cutting tool having improved fracture resistance. Further, adjusting the composition of the compound in the first composite nitride layer in the above-described manner allows for control over the orientation (ratio I(111)/I(200)) of the second composite nitride layer. If the average particle size of the particles which constitute of the first composite nitride layer is less than 100 nm, this can prevent the compressive stress of the second composite nitride layer from being increased, thereby resulting in the coated cutting tool having improved fracture resistance. With regard to the second composite nitride layer which forms the coating layer, if y of the composition $(Al_yCr_{1-y})N$ of the compound contained in such second composite nitride layer is 0.75 or more, this results in improved heat resistance. Accordingly, reaction wear can be prevented from being generated even in machining involving a high cutting temperature, such as high-speed machining or large-load machining, and this results in improved wear resistance of the coated cutting tool. Meanwhile, if y of the composition $(Al_yCr_{1-y})N$ of the compound contained in the second composite nitride layer is 0.90 or less, this leads to improved high-temperature strength and suppression of the formation of hexagonal crystals in the second composite nitride layer because the second composite nitride layer contains Cr, and this serves as a factor for improved wear resistance of the coated cutting tool. Further, the following feature in which: the second composite nitride layer comprises a cubic crystal system; and a ratio I(111)/I(200) of a peak intensity I(111) for a (111) plane of the second composite nitride layer to a peak intensity I(200) for a (200) plane of the second composite nitride layer in an X-ray diffraction analysis is 1.0 or more, indicates preferential orientation of a cubic crystal (111) plane in the second composite nitride layer. If the second composite nitride layer has such preferential orientation of a cubic crystal (111) plane, it tends to easily form a close-packed plane, so that the second composite nitride layer is less likely to be distorted. Thus, the second composite nitride layer has a high hardness, thereby resulting in the coated cutting tool having improved wear resistance. If the average particle size of the particles which constitute of the second composite nitride layer is 100 nm or more, this further suppresses the falling of particles, thereby resulting in the coated cutting tool having improved wear resistance. Further, if the residual stress of the second composite nitride layer is −10.0 GPa or higher, this allows for suppression of the generation of cracking after the formation of the coating layer, thereby resulting in the coated cutting tool having improved fracture resistance. Meanwhile, if the residual stress of the second composite nitride layer is −2.0 GPa or lower, this allows for suppression of the progress of cracking due to the effect of having a compressive stress, thereby resulting in the coated cutting tool having improved fracture resistance. With the combination of the above effects, the coated cutting tool of the present embodiment has improved wear resistance and fracture resistance and accordingly has a long tool life.

A coated cutting tool according to the present embodiment includes a substrate and a coating layer formed on a surface of the substrate. The substrate used in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is further preferably comprised of one or more kinds selected from the group consisting of a cemented carbide, cermet, ceramic and a cubic boron nitride sintered body because further excellent fracture resistance can be provided.

The coated cutting tool of the present embodiment shows the tendency of the wear resistance to be further improved if the average thickness of the entire coating layer is 1.0 μm or more. Meanwhile, the coated cutting tool of the present embodiment shows the tendency of the fracture resistance to be further improved if the average thickness of the entire coating layer is 6.0 μm or less. Therefore, the average thickness of the entire coating layer is preferably from 1.0 μm or more to 6.0 μm or less. In particular, from the same perspective as that set forth above, the average thickness of the entire coating layer is more preferably from 2.0 μm or more to 6.0 μm or less, and is further preferably from 3.0 μm or more to 5.5 μm or less.

[First Composite Nitride Layer]

In the coated cutting tool of the present embodiment, the coating layer includes a first composite nitride layer containing a compound having a composition represented by formula (1) below:

$$(Al_xCr_{1-x})N \quad (1)$$

(In formula (1), x denotes an atomic ratio of the Al element based on a total of the Al element and the Cr element and satisfies $0.75 \leq x \leq 0.90$).

With regard to the first composite nitride layer which forms the coating layer, if x of the composition $(Al_xCr_{1-x})N$ of the compound contained in such first composite nitride layer is from 0.75 or more to 0.90 or less, this leads to excellent adhesion with a second composite nitride layer, thereby resulting in the coated cutting tool having improved fracture resistance. Further, adjusting the composition of the compound in the first composite nitride layer in the above-described manner allows for control over the orientation (ratio I(111)/I(200)) of the second composite nitride layer.

In the present embodiment, when the composition of each composite nitride layer is represented by $(Al_{0.80}Cr_{0.20})N$, such representation indicates that the atomic ratio of the Al element based on a total of the Al element and the Cr element is 0.80 and that the atomic ratio of the Cr element based on a total of the Al element and the Cr element is 0.20. That is, such representation indicates that the amount of the Al element based on a total of the Al element and the Cr element is 80 atom % and that the amount of the Cr element based on a total of the Al element and the Cr element is 20 atom %.

In the coated cutting tool of the present embodiment, the average particle size of particles which constitute of the first composite nitride layer is less than 100 nm. If the average particle size of the particles which constitute of the first composite nitride layer is less than 100 nm, this can prevent the compressive stress of the second composite nitride layer from being increased, thereby resulting in the coated cutting tool having improved fracture resistance. From the same perspective, the average particle size of the particles which constitute of the first composite nitride layer is preferably less than 50 nm. The lower limit of the average particle size of the particles which constitute of the first composite nitride layer is not particularly limited; however, such lower limit may be, for example, 10 nm.

In the coated cutting tool of the present embodiment, the average thickness of the first composite nitride layer is from 0.1 μm or more to 1.0 μm or less. If the average thickness of the first composite nitride layer is 0.1 μm or more, this allows for the first composite nitride layer to further sufficiently cover the substrate surface, and thus, the effect of the coated cutting tool comprising the first composite nitride layer can be more effectively and reliably obtained. Meanwhile, if the average thickness of the first composite nitride layer is 1.0 μm or less, this results in improved wear resistance of the coated cutting tool.

[Second Composite Nitride Layer]

In the coated cutting tool of the present embodiment, the coating layer comprises a second composite nitride layer containing a compound having a composition represented by formula (2) below.

$$(Al_yCr_{1-y})N \quad (2)$$

(In formula (2), y denotes an atomic ratio of the Al element based on a total of the Al element and the Cr element and satisfies $0.75 \leq y \leq 0.90$)

With regard to the second composite nitride layer which forms the coating layer, if y of the composition $(Al_yCr_{1-y})N$ of the compound contained in such second composite nitride layer is 0.75 or more, this results in improved heat resistance. Accordingly, reaction wear can be prevented from being generated even in machining involving a high cutting temperature, such as high-speed machining or large-load machining, and this results in improved wear resistance of the coated cutting tool. Meanwhile, if y of the composition $(Al_yCr_{1-y})N$ of the compound contained in the second composite nitride layer is 0.90 or less, this leads to improved high-temperature strength and suppression of the formation of hexagonal crystals in the second composite nitride layer because the second composite nitride layer contains Cr, and this serves as a factor for improved wear resistance of the coated cutting tool.

In the coated cutting tool of the present embodiment, the average thickness of the second composite nitride layer is from 0.5 μm or more to 5.0 μm or less. If the average thickness of the second composite nitride layer is 0.5 μm or more, the effect of the coated cutting tool comprising the second composite nitride layer can be obtained more effectively and reliably. Meanwhile, if the average thickness of the second composite nitride layer is 5.0 μm or less, this can prevent the compressive stress from being increased, thereby resulting in the coated cutting tool having improved fracture resistance.

In the coated cutting tool of the present embodiment, the second composite nitride layer comprises a cubic crystal system, and a ratio I(111)/I(200) of a peak intensity I(111) for a (111) plane of the second composite nitride layer to a peak intensity I(200) for a (200) plane of the second composite nitride layer in an X-ray diffraction analysis is 1.0 or more. The following feature in which the second composite nitride layer comprises a cubic crystal system, and a ratio I(111)/I(200) of a peak intensity I(111) for a (111) plane of the second composite nitride layer to a peak intensity I(200) for a (200) plane of the second composite nitride layer in an X-ray diffraction analysis is 1.0 or more, indicates preferential orientation of a cubic crystal (111) plane of the second composite nitride layer. If the second composite nitride layer has such preferential orientation of a cubic crystal (111) plane, it tends to easily form a close-packed plane, so that the second composite nitride layer is less likely to be distorted. Thus, the second composite nitride layer has a high hardness, thereby resulting in the coated cutting tool having improved wear resistance. The upper limit of the I(111)/I(200) is not particularly limited; however, such upper limit may be, for example, 5.0.

The peak intensity for each crystal plane of the second composite nitride layer can be measured using a commercially available X-ray diffractometer. For instance, using model: RINT TTR III, being an X-ray diffractometer manufactured by Rigaku Corporation, an X-ray diffraction measurement by means of a 2θ/θ focusing optical system with Cu-Kα radiation is performed under the following conditions: an output: 50 kV, 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 20°-50°, whereby the peak intensity for each crystal plane can be measured. When obtaining the peak intensity for each crystal plane from an X-ray diffraction pattern, analytic software included with the X-ray diffractometer may be used. With such analytic software, background processing and Kα₂ peak removal are conducted using cubic spline, and profile fitting is conducted using Pearson-VII function, whereby each peak intensity can be obtained. It should be noted that, when various layers are formed between the second composite nitride layer and the substrate, each peak intensity can be measured by a thin-film X-ray diffraction method in order to avoid the influence of the layer. Further, when various layers are formed on a side opposite to the substrate across the second composite nitride layer, an X-ray diffraction measurement may be performed after the removal of such various layers via buffing.

In the coated cutting tool of the present embodiment, particles which constitute of the second composite nitride layer comprise columnar crystals with an aspect ratio of 2.0 or more. If the particles which constitute of the second composite nitride layer comprise columnar crystals with an aspect ratio of 2.0 or more, this allows for suppression of the falling of such particles, whereby the effect of providing the second composite nitride layer can be exerted for a long time. This results in improved wear resistance and fracture resistance of the coated cutting tool. It should be noted that an aspect ratio refers to the value obtained by dividing the longest axis of a particle which constitutes of the second composite nitride layer by the shortest axis thereof, and an aspect ratio closer to 1 refers to a more equiaxial particle. The upper limit of the aspect ratio with regard to the particles which constitute of the second composite nitride layer is not particularly limited; however, such upper limit may be, for example, 5.5.

In the coated cutting tool of the present embodiment, the average particle size of the particles which constitute of the second composite nitride layer is 100 nm or more. If the average particle size of the particles which constitute of the second composite nitride layer is 100 nm or more, this further suppresses the falling of particles, thereby resulting in the coated cutting tool having improved wear resistance. The upper limit of the average particle size of the particles which constitute of the second composite nitride layer is not particularly limited; however, such upper limit may be, for example, 200 nm.

In the present embodiment, the shape, aspect ratio and average particle size with regard to the particles which constitute of a composite nitride layer can be measured by observing a cross-sectional structure of the coated cutting tool, using an electron backscatter diffraction pattern apparatus (EBSD) attached to a scanning electron microscope (SEM), a field emission scanning electron microscope (FE-SEM) or the like, and the crystal system of the particles can be determined in an X-ray diffraction measurement. More specifically, for instance, mirror polishing is firstly performed on the coated cutting tool in a direction orthogonal or substantially orthogonal to the substrate surface so as to obtain a cross-sectional structure. Examples of a method of obtaining a cross-sectional structure of the coated cutting tool are not particularly limited; however, such examples include: a polishing method with the use of diamond paste or colloidal silica; and ion milling. Next, a sample having the cross-sectional structure of the coated cutting tool is set on the FE-SEM, and the cross-sectional structure of the sample is then irradiated with an electron beam, at an angle of incidence of 70°, with an acceleration voltage of 15 kV and an irradiation current of 0.5 nA. Using the EBSD, a cross-sectional structure in the flank of the coated cutting tool is preferably measured with a measurement range of 300 μm² and a step size of 0.1 μm. At this time, a boundary with a misorientation of 5° or more is regarded as a grain boundary, and an area surrounded by such grain boundary is defined as referring to a particle. Further, herein, a particle size refers to the value of an axis of a particle which constitutes of each layer, wherein such axis is directed parallel to the substrate surface. As to each of the composite nitride layers, the shape, crystal system, aspect ratio and average size with regard to the particles specified as above can be obtained.

Further, in the coated cutting tool of the present embodiment, the residual stress of the second composite nitride layer is from −10.0 GPa or higher to −2.0 GPa or lower. If the residual stress of the second composite nitride layer is −10.0 GPa or higher, this allows for suppression of the generation of cracking after the formation of the coating layer, thereby resulting in the coated cutting tool having improved fracture resistance. Meanwhile, if the residual stress of the second composite nitride layer is −2.0 GPa or lower, this allows for suppression of the progress of cracking, due to the effect of having a compressive stress, and this thereby results in the coated cutting tool having improved fracture resistance.

The above residual stress refers to an internal stress (inherent distortion) remaining in the coating layer. In general, a stress represented by a "−" (minus) value is referred to as a compressive stress, and a stress represented by a "+" (plus) value is referred to as a tensile stress. In the present embodiment, when indicating the magnitude of a residual stress, a greater "+" value means a greater residual stress, and a smaller "−" value means a smaller residual stress.

The above residual stress can be measured by a $\sin^2\varphi$ method using an X-ray diffractometer. Such residual stress can be measured by: measuring, through the $\sin^2\varphi$ method, the stresses at any three locations included in a portion involved in cutting (such locations are preferably selected so as to be apart from one another by 0.5 mm or more, such that the relevant stresses typify the stresses of the above portion); and obtaining the average value of such stresses.

The FIGURE is a schematic cross-sectional view showing an example of a coated cutting tool according to the present embodiment. A coated cutting tool 5 comprises a substrate 1 and a coating layer 4 formed on a surface of the substrate 1. Further, the coating layer 4 comprises: a first composite nitride layer 2 formed on the surface of the substrate 1; and a second composite nitride layer 3 formed on a surface of the first composite nitride layer 2 which is located on a side opposite to the substrate 1.

In the coated cutting tool of the present embodiment, the coating layer preferably has an alternating laminate structure in which the first composite nitride layer and the second composite nitride layer are repeatedly formed twice or more in an alternating manner. In the coated cutting tool of the present embodiment, if the coating layer preferably has an alternating laminate structure in which the first composite nitride layer and the second composite nitride layer are repeatedly formed twice or more in an alternating manner, this can prevent the compressive stress from being increased, thereby showing the tendency of the fracture resistance to be improved, and this allows for an increased thickness of the entire coating layer, thereby showing the tendency of the wear resistance to be further improved.

In the present embodiment, when one first composite nitride layer and one second composite nitride layer are formed, the "number of repeats" is one.

The coating layer used in the present embodiment may be comprised of the respective composite nitride layers alone. However, it is preferable for a lower layer to be provided between the substrate and the composite nitride layers (i.e., located as a layer below the first composite nitride layer).

This further improves the adhesion between the substrate and the composite nitride layer. In particular, the lower layer, from the same perspective as that set forth above, preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti, V, Nb, Ta, Cr, Mo, W, Al, Si and Y; and an element of at least one kind selected from the group consisting of C, N, O and B, and further preferably contains a compound of: an element of at least one kind selected from the group consisting of Ti, Ta, Cr, W, Al, Si and Y; and N. Further, the lower layer may be comprised of a single layer or multiple layers of two or more layers.

In the present embodiment, the average thickness of the lower layer is preferably from 0.1 μm or more to 3.5 μm or less because this indicates the tendency of the adhesion between the substrate and the coating layer to be further improved. From the same perspective, the average thickness of the lower layer is more preferably from 0.2 μm or more to 3.0 μm or less, and is further preferably from 0.3 μm or more to 2.5 μm or less.

The coating layer used in the present embodiment may have an upper layer on a side of the composite nitride layers which is opposite to the substrate (i.e., located as an upper layer on the second composite nitride layer), preferably on a surface of the second composite nitride layer. The upper layer further preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B because further excellent wear resistance is achieved. Further, from the same perspective as that set forth above, the upper layer preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti, V, Nb, Ta, Cr, Mo, W, Al, Si and Y; and an element of at least one kind selected from the group consisting of C, N, O and B, and further preferably contains a compound of: an element of at least one kind selected from the group consisting of Ti, Nb, Ta, Cr, W, Al, Si and Y; and N. Further, the upper layer may be comprised of a single layer or multiple layers of two or more layers.

In the present embodiment, the average thickness of the upper layer is preferably from 0.1 μm or more to 3.5 μm or less because this indicates the tendency of the wear resistance to be excellent. From the same perspective, the average thickness of the upper layer is more preferably from 0.2 μm or more to 3.0 μm or less, and is further preferably from 0.3 μm or more to 2.5 μm or less.

A method of manufacturing a coating layer in a coated cutting tool according to the present embodiment is not particularly limited. However, examples of such method include physical vapor deposition methods, such as an ion plating method, an arc ion plating method, a sputtering method and an ion mixing method. The coating layer is preferably formed by a physical vapor deposition method because sharp edges can be formed. In particular, the arc ion plating method is more preferable because further excellent adhesion is achieved between the coating layer and the substrate.

A method of manufacturing a coated cutting tool according to the present embodiment will be described below, using specific examples. It should be noted that the method of manufacturing a coated cutting tool according to the present embodiment is not particularly limited, as long as the configurations of the coated cutting tool may be achieved.

First, a substrate processed in a tool shape is received in a reactor of a physical vapor deposition apparatus, and metal evaporation sources are placed in the reactor. Thereafter, the reactor is evacuated until the pressure therein indicates a vacuum of $1.0 \times 10^{-2}$ Pa or lower, and the substrate is heated, by a heater in the reactor, until the temperature reaches from 200° C. or higher to 700° C. or lower. After the heating, an Ar gas is introduced into the reactor so that the pressure therein is from 0.5 Pa or higher to 5.0 Pa or lower. In the Ar gas atmosphere with a pressure of from 0.5 Pa or higher to 5.0 Pa or lower, a bias voltage of from −500 V or higher to −350 V or lower is applied to the substrate, and a current of from 40 A or higher to 50 A or lower is caused to flow through a tungsten filament in the reactor, whereby an ion bombardment process is carried out, with the Ar gas, on a surface of the substrate. After the ion bombardment process is carried out on the substrate surface, the reactor is evacuated until the pressure therein indicates a vacuum of $1.0 \times 10^{-2}$ Pa or lower.

When forming the lower layer used in the present embodiment, the substrate is heated until the temperature is from 400° C. or higher to 600° C. or lower. After the heating, a gas is introduced into the reactor such that the pressure therein is from 0.5 Pa or higher to 5.0 Pa or lower. Examples of such gas include an $N_2$ gas when the lower layer comprises a compound of: an element of at least one kind selected from the group consisting of Ti, Zr, Hf, V, Nb, Ta, Cr, Mo, W, Al, Si and Y; and N, and further examples of such gas also include a gas mixture of an $N_2$ gas and a $C_2H_2$ gas when the lower layer comprises a compound of: an element of at least one kind selected from the group consisting of Ti, Zr, Hf, V, Nb, Ta, Cr, Mo, W, Al, Si and Y; and N and C. The volume ratio of the gas mixture is not particularly limited; however, such volume ratio may be $N_2$ gas:$C_2H_2$ gas=95:5 to 85:15, by way of example. Then, a bias voltage of from −80 V or higher to −40 V or lower is applied to the substrate, and a metal evaporation source according to the metal components of each layer is evaporated via an arc discharge with an arc current of from 100 A or higher to 200 A or lower, whereby the lower layer may be formed.

When forming the first composite nitride layer used in the present embodiment, the substrate is controlled such that the temperature is from 200° C. or higher to 400° C. or lower, a nitrogen gas ($N_2$) is introduced in the reactor, and the pressure in the reactor is set at from 0.5 Pa or higher to 4.0 Pa or lower. Thereafter, a bias voltage of from −80 V or higher to −40 V or lower is applied to the substrate, and a metal evaporation source according to the metal components of the first composite nitride layer is evaporated via an arc discharge with an arc current of from 80 A or higher to 150 A or lower, whereby the first composite nitride layer may be formed.

When forming the second composite nitride layer used in the present embodiment, the substrate is controlled such that the temperature is from 200° C. or higher to 400° C. or lower. It should be noted that the substrate temperature is preferably the same as the substrate temperature when the first composite nitride layer is formed because the first composite nitride layer and the second composite nitride layer can be formed in a continuous manner. After the temperature control, an $N_2$ gas is introduced into the reactor so that the pressure therein is from 0.5 Pa or higher to 4.0 Pa or lower. Then, a bias voltage of from −200 V or higher to −130 V or lower is applied to the substrate, and a metal evaporation source according to the metal components of the second composite nitride layer is evaporated via an arc discharge with an arc current of from 80 A or higher to 150 A or lower, whereby the second composite nitride layer may be formed.

In order to form the alternating laminate structure of the first composite nitride layer and the second composite nitride layer, two or more kinds of metal evaporation sources are evaporated in an alternating manner via an arc discharge under the conditions set forth above, whereby the respective composite nitride layers may be formed in an alternating manner. By adjusting the arc discharge time for each of the metal evaporation sources, the thickness of each composite nitride layer which constitutes the alternating laminate structure can be controlled.

In order to set a desired value for the aspect ratio of the particles which constitute of the second composite nitride layer used in the present embodiment, in the above-described process of forming the second composite nitride layer, the bias voltage may be adjusted, or the Al ratio of the compound represented by formula (2) which is contained in the second composite nitride layer may be adjusted. More specifically, in the process of forming the second composite nitride layer, the application of a higher negative bias voltage shows the tendency of the aspect ratio to be increased. Further, an increased Al ratio of the compound represented by formula (2) which is contained in the second composite nitride layer shows the tendency of the aspect ratio to be decreased.

In order to set a predetermined value for the X-ray diffraction intensity ratio I(111)/I(200) in the second composite nitride layer used in the present embodiment, in the above-described process of forming the second composite nitride layer, the temperature of the substrate may be adjusted, the pressure in the reactor may be adjusted, or the arc current may be adjusted. Further, in the above-described process of forming the first composite nitride layer and/or the second composite nitride layer, the thickness(es) of the first composite nitride layer and/or the second composite nitride layer may be controlled. More specifically, in the process of forming the second composite nitride layer, a decreased temperature of the substrate or a decreased pressure in the reactor shows the tendency of the I(111)/I(200) to be increased, whereas an increased arc current shows the tendency of the I(111)/I(200) to be decreased. Moreover, in the process of forming the first composite nitride layer, a decreased thickness of the first composite nitride layer shows the tendency of the I(111)/I(200) to be increased, and, in the process of forming the first composite nitride layer and the second composite nitride layer, an increased thickness of the first composite nitride layer and a decreased thickness of the second composite nitride layer show the tendency of the I(111)/I(200) to be decreased through preferential growth of a (200) plane.

In order to set a predetermined value for the residual stress of the second composite nitride layer used in the present embodiment, in the above-described process of forming the second composite nitride layer, the temperature of the substrate may be adjusted, the bias voltage may be adjusted, or the Al ratio of the compound represented by formula (2) which is contained in the second composite nitride layer may be adjusted, and, in the above-described process of forming the first composite nitride layer and/or the second composite nitride layer, the thickness(es) of the first composite nitride layer and/or the second composite nitride layer may be controlled. More specifically, in the process of forming the second composite nitride layer, if the temperature of the substrate may be decreased, if a higher negative voltage is applied, or if the Al ratio of the compound represented by formula (2) which is contained in the second composite nitride layer is increased, this shows the tendency of the residual stress of the second composite nitride layer to be decreased. Further, in the process of forming the first composite nitride layer, if the thickness of the first composite nitride layer is increased, this shows the tendency of the residual stress of the second composite nitride layer to be decreased, and, in the process of forming the second composite nitride layer, if the thickness of the second composite nitride layer is increased, this shows the tendency of the residual stress of the second composite nitride layer to be decreased.

In order to set a desired value for the average particle size of the particles which constitute of each composite nitride layer used in the present embodiment, the bias voltage may be controlled in the above-described process of forming the composite nitride layer. The application of a higher negative bias voltage shows the tendency of the average particle size of each composite nitride layer to be increased. Accordingly, the average particle size of each composite nitride layer can be controlled by adjusting the bias voltage.

When forming the upper layer used in the present embodiment, such upper layer may be formed under the same manufacturing conditions as those described above for the lower layer. That is, first, the substrate is heated until the temperature is from 400° C. or higher to 600° C. or lower. After the heating, a gas is introduced into the reactor such that the pressure therein is from 0.5 Pa or higher to 5.0 Pa or lower. Examples of such gas include an $N_2$ gas when the upper layer comprises a compound of: an element of at least one kind selected from the group consisting of Ti, Zr, Hf, V, Nb, Ta, Cr, Mo, W, Al, Si and Y; and N, and further examples of such gas also include a gas mixture of an $N_2$ gas and a $C_2H_2$ gas when the upper layer comprises a compound of: an element of at least one kind selected from the group consisting of Ti, Zr, Hf, V, Nb, Ta, Cr, Mo, W, Al, Si and Y; and N and C. The volume ratio of the gas mixture is not particularly limited; however, such volume ratio may be $N_2$ gas:$C_2H_2$ gas=95:5 to 85:15, by way of example. Then, a bias voltage of from −80 V or higher to −40 V or lower is applied to the substrate, and a metal evaporation source according to the metal components of each layer is evaporated via an arc discharge with an arc current of from 100 A or higher to 200 A or lower, whereby the upper layer may be formed.

The thickness of each layer which constitutes the coating layer in the coated cutting tool of the present embodiment can be measured from a cross-sectional structure of the coated cutting tool, using an optical microscope, a scanning electron microscope (SEM), a transmission electron microscope (TEM), or the like. It should be noted that, as to the average thickness of each layer in the coated cutting tool of the present embodiment, such average thickness can be obtained by: measuring the thickness of each layer, from each of the cross-sectional surfaces at three or more locations near the position 50 μm from the edge of a surface facing the metal evaporation source, toward the center of such surface; and calculating the average value (arithmetic mean) of the resulting measurements.

The composition of each layer which constitutes the coating layer in the coated cutting tool of the present embodiment can be measured from a cross-sectional structure of the coated cutting tool of the present embodiment, using an energy-dispersive X-ray spectroscope (EDS), a wavelength-dispersive X-ray spectroscope (WDS), or the like.

The coated cutting tool of the present embodiment can be considered to provide the effect of being capable of extending the tool life compared with the prior art due to, at the very least, the point of having excellent wear resistance and fracture resistance (it should be noted, however, that the factor of such extension of tool life is not limited thereto). Specific examples of types of the coated cutting tool of the present embodiment include an indexable cutting insert for milling or turning, a drill, an end mill, etc.

EXAMPLES

Although the present invention will be described in further detail below, with examples, the present invention is not limited to such examples.

Example 1

An insert of LNMU0303ZER-MJ (manufactured by Tungaloy Corporation; a cemented carbide with a composition of 89.8% WC-9.8% Co-0.3% $Cr_3C_2$ (mass %)) was prepared as a substrate. In a reactor of an arc ion plating apparatus, a metal evaporation source was arranged so as to achieve the composition of each layer shown in each of Tables 1 and 2. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 450° C. After the heating, an Ar gas was introduced into the reactor such that the pressure therein was 2.7 Pa.

In the Ar gas atmosphere with a pressure of 2.7 Pa, a bias voltage of −400 V was applied to the substrate, and a current of 40 A was caused to flow through a tungsten filament in the reactor, whereby an ion bombardment process was carried out, with the Ar gas, on a surface of the substrate for 30 minutes. After the ion bombardment process, the reactor was evacuated until the pressure therein indicated a vacuum of $5.0 \times 10^{-3}$ Pa or lower.

As to invention samples 1 to 15, after the evacuation, the substrate was controlled such that the temperature reached the temperature shown in each of Tables 3 and 4 (temperature when the deposition was started), a nitrogen gas ($N_2$) was introduced into the reactor, and an adjustment was conducted to achieve the pressure shown in each of Tables 3 and 4 in the reactor. Thereafter, the bias voltage shown in each of Tables 3 and 4 was applied to the substrate, and the metal evaporation sources for the first composite nitride layer and the second composite nitride layer respectively having the compositions shown in Table 1 were evaporated in this order in an alternating manner via an arc discharge with the arc currents shown in Tables 3 and 4, whereby the first composite nitride layer and the second composite nitride layer were formed on the substrate surface in this order in an alternating manner. At this time, control was carried out so as to achieve the pressures, which are shown in Tables 3 and 4, in the reactor. Further, with regard to each of the thicknesses of the first composite nitride layer and the second composite nitride layer, the arc discharge time was adjusted for control so as to achieve the thickness shown in Table 1.

As to comparative samples 1 and 4, after the evacuation, the substrate was controlled such that the temperature reached the temperature shown in Table 6 (temperature when the deposition was started), a nitrogen gas ($N_2$) was introduced into the reactor, and an adjustment was conducted to achieve the pressure shown in Table 6 in the reactor. Thereafter, the bias voltage shown in Table 6 was applied to the substrate, and the metal evaporation source involving the composition shown in Table 2 was evaporated via an arc discharge with the arc current shown in Table 6, whereby a single layer (B layer) having the thickness shown in Table 2 was formed on the surface of the substrate.

As to comparative samples 2, 3 and 5 to 10, after the evacuation, the substrate was controlled such that the temperature reached the temperature shown in each of Tables 5 and 6 (temperature when the deposition was started), a nitrogen gas ($N_2$) was introduced into the reactor, and an adjustment was conducted to achieve the pressure shown in each of Tables 5 and 6 in the reactor. Thereafter, the bias voltage shown in each of Tables 5 and 6 was applied to the substrate, and the metal evaporation sources for the A layer and the B layer respectively having the compositions shown in Table 2 were evaporated in this order in an alternating manner via an arc discharge with the arc current shown in each of Tables 5 and 6, whereby the A layer and the B layer were formed on the substrate surface in this order in an alternating manner. At this time, control was carried out so as to achieve the pressure shown in each of Tables 5 and 6, in the reactor. Further, with regard to each of the thicknesses of the A layer and the B layer, the arc discharge time was adjusted for control so as to achieve the thickness shown in Table 2.

After the formation of each layer with the predetermined average thickness shown in each of Tables 1 and 2 on the substrate surface, the heater was turned off, and the sample was taken out of the reactor after the temperature of the sample reached 100° C. or lower.

TABLE 1

| | Coating layer | | | | | |
|---|---|---|---|---|---|---|
| | First composite nitride layer | | Second composition nitride layer | | | Average thickness of entire |
| Sample No. | Composition | Average thickness (μm) | Composition | Average thickness (μm) | Number of repeats (times) | coating layer (μm) |
| Invention sample 1 | $(Al_{0.75}Cr_{0.25})N$ | 0.5 | $(Al_{0.75}Cr_{0.25})N$ | 1.0 | 2 | 3.0 |
| Invention sample 2 | $(Al_{0.80}Cr_{0.20})N$ | 0.5 | $(Al_{0.80}Cr_{0.20})N$ | 1.0 | 2 | 3.0 |

TABLE 1-continued

| | Coating layer | | | | | |
|---|---|---|---|---|---|---|
| | First composite nitride layer | | Second composition nitride layer | | | Average thickness of entire coating layer (μm) |
| Sample No. | Composition | Average thickness (μm) | Composition | Average thickness (μm) | Number of repeats (times) | |
| Invention sample 3 | $(Al_{0.90}Cr_{0.10})N$ | 0.5 | $(Al_{0.90}Cr_{0.10})N$ | 1.0 | 2 | 3.0 |
| Invention sample 4 | $(Al_{0.80}Cr_{0.20})N$ | 0.2 | $(Al_{0.80}Cr_{0.20})N$ | 0.8 | 3 | 3.0 |
| Invention sample 5 | $(Al_{0.80}Cr_{0.20})N$ | 0.1 | $(Al_{0.80}Cr_{0.20})N$ | 0.9 | 3 | 3.0 |
| Invention sample 6 | $(Al_{0.80}Cr_{0.20})N$ | 1.0 | $(Al_{0.80}Cr_{0.20})N$ | 2.0 | 1 | 3.0 |
| Invention sample 7 | $(Al_{0.80}Cr_{0.20})N$ | 1.0 | $(Al_{0.80}Cr_{0.20})N$ | 5.0 | 1 | 6.0 |
| Invention sample 8 | $(Al_{0.80}Cr_{0.20})N$ | 0.5 | $(Al_{0.80}Cr_{0.20})N$ | 1.5 | 3 | 6.0 |
| Invention sample 9 | $(Al_{0.80}Cr_{0.20})N$ | 0.2 | $(Al_{0.80}Cr_{0.20})N$ | 0.8 | 3 | 3.0 |
| Invention sample 10 | $(Al_{0.80}Cr_{0.20})N$ | 0.2 | $(Al_{0.80}Cr_{0.20})N$ | 0.8 | 3 | 3.0 |
| Invention sample 11 | $(Al_{0.80}Cr_{0.20})N$ | 0.2 | $(Al_{0.80}Cr_{0.20})N$ | 0.8 | 3 | 3.0 |
| Invention sample 12 | $(Al_{0.80}Cr_{0.20})N$ | 0.2 | $(Al_{0.80}Cr_{0.20})N$ | 0.8 | 3 | 3.0 |
| Invention sample 13 | $(Al_{0.80}Cr_{0.20})N$ | 0.2 | $(Al_{0.80}Cr_{0.20})N$ | 0.8 | 3 | 3.0 |
| Invention sample 14 | $(Al_{0.80}Cr_{0.20})N$ | 0.2 | $(Al_{0.80}Cr_{0.20})N$ | 0.8 | 3 | 3.0 |
| Invention sample 15 | $(Al_{0.80}Cr_{0.20})N$ | 0.2 | $(Al_{0.80}Cr_{0.20})N$ | 0.8 | 3 | 3.0 |

TABLE 2

| | Coating layer | | | | | |
|---|---|---|---|---|---|---|
| | A layer | | B layer | | | Average thickness of entire coating layer (μm) |
| Sample No. | Composition | Average thickness (μm) | Composition | Average thickness (μm) | Number of repeats (times) | |
| Comparative sample 1 | — | — | $(Al_{0.80}Cr_{0.20})N$ | 3.0 | 1 | 3.0 |
| Comparative sample 2 | $(Al_{0.95}Cr_{0.05})N$ | 0.5 | $(Al_{0.95}Cr_{0.05})N$ | 1.0 | 2 | 3.0 |
| Comparative sample 3 | $(Al_{0.80}Cr_{0.20})N$ | 0.5 | $(Al_{0.80}Cr_{0.20})N$ | 6.0 | 1 | 6.5 |
| Comparative sample 4 | — | — | $(Al_{0.70}Cr_{0.30})N$ | 3.0 | 1 | 3.0 |
| Comparative sample 5 | $(Al_{0.80}Cr_{0.20})N$ | 0.2 | $(Al_{0.80}Cr_{0.20})N$ | 0.8 | 3 | 3.0 |
| Comparative sample 6 | $(Al_{0.80}Cr_{0.20})N$ | 0.2 | $(Al_{0.80}Cr_{0.20})N$ | 0.8 | 3 | 3.0 |
| Comparative sample 7 | $(Al_{0.80}Cr_{0.20})N$ | 0.2 | $(Al_{0.80}Cr_{0.20})N$ | 0.8 | 3 | 3.0 |
| Comparative sample 8 | $(Al_{0.80}Cr_{0.20})N$ | 0.2 | $(Al_{0.80}Cr_{0.20})N$ | 0.8 | 3 | 3.0 |
| Comparative sample 9 | $(Al_{0.80}Cr_{0.20})N$ | 0.2 | $(Al_{0.80}Cr_{0.20})N$ | 0.8 | 3 | 3.0 |
| Comparative sample 10 | $(Al_{0.80}Ti_{0.20})N$ | 0.2 | $(Al_{0.80}Cr_{0.20})N$ | 0.8 | 3 | 3.0 |

* The "—" symbol in the A layer column for each of comparative samples 1 and 4 in the table indicates that no A layers are formed.

TABLE 3

| | First composite nitride layer | | | |
|---|---|---|---|---|
| Sample No. | Temperature (° C.) | Pressure (Pa) | Voltage (V) | Current (A) |
| Invention sample 1 | 300 | 2 | −80 | 100 |
| Invention sample 2 | 300 | 2 | −80 | 100 |
| Invention sample 3 | 300 | 2 | −80 | 100 |
| Invention sample 4 | 300 | 2 | −80 | 100 |
| Invention sample 5 | 300 | 2 | −80 | 100 |
| Invention sample 6 | 300 | 2 | −80 | 100 |
| Invention sample 7 | 300 | 2 | −80 | 100 |
| Invention sample 8 | 300 | 2 | −80 | 100 |
| Invention sample 9 | 300 | 2 | −60 | 100 |
| Invention sample 10 | 300 | 2 | −40 | 100 |
| Invention sample 11 | 300 | 2 | −40 | 100 |
| Invention sample 12 | 300 | 3 | −40 | 100 |
| Invention sample 13 | 300 | 4 | −40 | 100 |
| Invention sample 14 | 300 | 2 | −80 | 100 |
| Invention sample 15 | 300 | 2 | −80 | 100 |

TABLE 4

| | Second composite nitride layer | | | |
|---|---|---|---|---|
| Sample No. | Temperature (° C.) | Pressure (Pa) | Voltage (V) | Current (A) |
| Invention sample 1 | 300 | 2 | −130 | 100 |
| Invention sample 2 | 300 | 2 | −150 | 100 |
| Invention sample 3 | 300 | 2 | −170 | 100 |
| Invention sample 4 | 300 | 2 | −150 | 100 |
| Invention sample 5 | 300 | 2 | −150 | 100 |
| Invention sample 6 | 300 | 2 | −150 | 100 |
| Invention sample 7 | 300 | 2 | −150 | 100 |
| Invention sample 8 | 300 | 2 | −150 | 100 |
| Invention sample 9 | 300 | 2 | −150 | 100 |
| Invention sample 10 | 300 | 2 | −150 | 100 |
| Invention sample 11 | 300 | 2 | −200 | 100 |
| Invention sample 12 | 300 | 3 | −150 | 100 |
| Invention sample 13 | 300 | 4 | −150 | 100 |
| Invention sample 14 | 300 | 2 | −150 | 150 |
| Invention sample 15 | 300 | 2 | −150 | 80 |

TABLE 5

| | A Layer | | | |
|---|---|---|---|---|
| Sample No. | Temperature (° C.) | Pressure (Pa) | Voltage (V) | Current (A) |
| Comparative sample 1 | — | — | — | — |
| Comparative sample 2 | 300 | 2 | −80 | 100 |
| Comparative sample 3 | 300 | 2 | −80 | 100 |
| Comparative sample 4 | — | — | — | — |
| Comparative sample 5 | 300 | 2 | −80 | 100 |
| Comparative sample 6 | 300 | 2 | −20 | 100 |
| Comparative sample 7 | 300 | 5 | −80 | 100 |
| Comparative sample 8 | 300 | 2 | −80 | 100 |
| Comparative sample 9 | 300 | 2 | −200 | 100 |
| Comparative sample 10 | 300 | 2 | −80 | 100 |

* The "—" symbols for each of comparative samples 1 and 4 in the table indicate that no A layers are formed.

TABLE 6

| | B Layer | | | |
|---|---|---|---|---|
| Sample No. | Temperature (° C.) | Pressure (Pa) | Voltage (V) | Current (A) |
| Comparative sample 1 | 350 | 5 | −150 | 100 |
| Comparative sample 2 | 300 | 2 | −200 | 100 |
| Comparative sample 3 | 300 | 2 | −150 | 100 |
| Comparative sample 4 | 300 | 2 | −130 | 100 |
| Comparative sample 5 | 300 | 2 | −220 | 100 |
| Comparative sample 6 | 300 | 2 | −150 | 100 |
| Comparative sample 7 | 300 | 5 | −150 | 100 |
| Comparative sample 8 | 300 | 2 | −150 | 200 |
| Comparative sample 9 | 300 | 2 | −150 | 100 |
| Comparative sample 10 | 300 | 2 | −150 | 200 |

As to the average thickness of each layer of each of the obtained samples, such average thickness was obtained by: measuring the thickness of each layer via a TEM observation of each of the cross-sectional surfaces at three locations near the position 50 μm from the edge of a surface facing the metal evaporation source of the coated cutting tool, toward the center of such surface; and calculating the average value (arithmetic mean) of the resulting measurements. The results are shown in Tables 1 and 2.

The composition of each layer of the obtained sample was measured from the cross-sectional surface near the position at most 50 μm from the edge of a surface facing the metal evaporation source of the coated cutting tool, toward the center of such surface, using an EDS attached to a TEM. The measurement results are shown in Tables 1 and 2. It should be noted that the composition ratio of the metal elements of each layer in each of Tables 1 and 2 refers to an atomic ratio of each metal element relative to all the metal elements in the metal compound which constitutes each layer.

[Shape, Crystal System, Aspect Ratio and Average Particle Size with Regard to Particles]

As to the particles in either the second composite nitride layer or the B layer in each of the obtained samples, the shape, aspect ratio and average particle size were measured using an EBSD attached to an FE-SEM, and the crystal system was determined through an X-ray diffraction measurement. More specifically, the coated cutting tool was polished using diamond paste and then subjected to finishing polishing with the use of colloidal silica, thereby obtaining a cross-sectional structure of the coated cutting tool. The sample having the cross-sectional structure of the coated cutting tool was set on the FE-SEM, and the cross-sectional structure of the sample was then irradiated with an electron beam, at an angle of incidence of 70°, with an acceleration voltage of 15 kV and an irradiation current of 0.5 nA. Using the EBSD, a cross-sectional structure in the flank of the coated cutting tool was measured with a measurement range of 300 μm² and a step size of 0.1 μm. At this time, a boundary with a misorientation of 5° or more was regarded as a grain boundary, and an area surrounded by such grain boundary was defined as referring to a particle. Herein, the particle size was defined as the value of an axis in a direction parallel to the surface of the substrate in a particle which constitutes each layer. As to each of the second composite nitride layer and the B layer, the shape, crystal system, aspect ratio and average particle size with regard to the specified particles were obtained. The results are shown in Tables 7 and 8.

Further, as to either the first composite nitride layer or the A layer of each of the obtained samples, the average particle size of the specified particles was obtained in the same way as above. The results are shown in Tables 7 and 8.

[I(111)/I(200)]

The ratio I(111)/I(200) of either the second composite nitride layer or the B layer of each of the obtained samples was measured, using model: RINT TTR III, being an X-ray diffractometer manufactured by Rigaku Corporation. More specifically, the ratio I(111)/I(200) was calculated by measuring a peak intensity I(200) for a (200) plane of either the second composite nitride layer or the B layer and a peak intensity I(111) for a (111) plane of either the second composite nitride layer or the B layer via an X-ray diffraction measurement by means of a 2θ/θ focusing optical system with Cu-Kα radiation under the following conditions: an output: 50 kV, 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 20°-50°. The results are shown in Tables 7 and 8.

[Residual Stress]

As to each of the obtained samples, the residual stress of either the second composite nitride layer or the B layer was measured by a $\sin^2\varphi$ method using an X-ray diffractometer. Such residual stress of the second composite nitride layer or the B layer was obtained by: measuring the stresses at any three locations included in a portion involved in cutting; and calculating the average value (arithmetic mean) of the resulting measurements. The results are shown in Tables 7 and 8.

TABLE 7

| Sample No. | First composite nitride layer Particle average size (nm) | Second composite nitride layer | | | | | |
|---|---|---|---|---|---|---|---|
| | | I(111)/I(200) | Crystal system | Particle average size (nm) | Particle aspect ratio | Particle shape | Residual stress (GPa) |
| Invention sample 1 | 42 | 1.1 | Cubic | 156 | 5.1 | Columnar crystal | −2.5 |
| Invention sample 2 | 33 | 1.2 | Cubic | 124 | 3.2 | Columnar crystal | −3.0 |
| Invention sample 3 | 19 | 1.5 | Cubic | 103 | 2.4 | Columnar crystal | −4.0 |
| Invention sample 4 | 29 | 2.0 | Cubic | 102 | 3.4 | Columnar crystal | −4.5 |
| Invention sample 5 | 31 | 3.0 | Cubic | 111 | 3.2 | Columnar crystal | −6.0 |
| Invention sample 6 | 32 | 1.1 | Cubic | 119 | 3.2 | Columnar crystal | −8.0 |
| Invention sample 7 | 30 | 1.0 | Cubic | 127 | 3.1 | Columnar crystal | −10.0 |
| Invention sample 8 | 32 | 1.1 | Cubic | 120 | 3.1 | Columnar crystal | −8.5 |
| Invention sample 9 | 25 | 1.4 | Cubic | 103 | 3.1 | Columnar crystal | −2.5 |
| Invention sample 10 | 18 | 1.6 | Cubic | 105 | 3.2 | Columnar crystal | −2.0 |
| Invention sample 11 | 19 | 1.6 | Cubic | 144 | 4.1 | Columnar crystal | −5.0 |
| Invention sample 12 | 20 | 1.4 | Cubic | 102 | 3.4 | Columnar crystal | −4.5 |
| Invention sample 13 | 15 | 1.2 | Cubic | 100 | 3.1 | Columnar crystal | −4.0 |
| Invention sample 14 | 20 | 1.0 | Cubic | 111 | 2.9 | Columnar crystal | −3.2 |
| Invention sample 15 | 21 | 1.5 | Cubic | 114 | 3.2 | Columnar crystal | −3.0 |

TABLE 8

| Sample No. | A layer Particle average size (nm) | B layer | | | | | |
|---|---|---|---|---|---|---|---|
| | | I(111)/I(200) | Crystal system | Particle average size (nm) | Particle aspect ratio | Particle shape | Residual stress (GPa) |
| Comparative sample 1 | — | 0.5 | Cubic | 126 | 2.0 | Columnar crystal | −11.0 |
| Comparative sample 2 | 8 | 1.6 | Cubic | 68 | 1.5 | Columnar crystal | −5.0 |
| Comparative sample 3 | 34 | 0.9 | Cubic | 105 | 2.9 | Columnar crystal | −12.0 |
| Comparative sample 4 | — | 3.1 | Cubic | 182 | 5.9 | Columnar crystal | −5.0 |

TABLE 8-continued

| Sample No. | A layer Particle average size (nm) | I(111)/I(200) | Crystal system | B layer Particle average size (nm) | Particle aspect ratio | Particle shape | Residual stress (GPa) |
|---|---|---|---|---|---|---|---|
| Comparative sample 5 | 39 | 2.1 | Cubic | 95 | 3.1 | Columnar crystal | −11.0 |
| Comparative sample 6 | 11 | 2.2 | Cubic | 102 | 3.2 | Columnar crystal | −1.5 |
| Comparative sample 7 | 31 | 0.8 | Cubic | 94 | 3.1 | Columnar crystal | −6.0 |
| Comparative sample 8 | 42 | 0.8 | Cubic | 104 | 2.8 | Columnar crystal | −3.5 |
| Comparative sample 9 | 142 | 4.2 | Cubic | 102 | 4.7 | Columnar crystal | −14.0 |
| Comparative sample 10 | 15 | 0.5 | Cubic | 106 | 3.0 | Columnar crystal | −3.5 |

\*\* The "—" symbol in the A layer column for each of comparative samples 1 and 4 in the table indicates that no A layers are formed.

Using the obtained samples, the following cutting test was conducted in order to perform evaluations.

[Cutting Test]
Workpiece: S55C
Workpiece shape: Plate of 200 mm×150 mm×70 mm
Cutting speed: 200 m/min
Feed per tooth: 1.0 mm/tooth
Depth of cut: 0.6 mm
Width of cut: 15 mm
Coolant: Used
Evaluation items: A time when a sample was fractured (chipping occurred in the cutting edge of a sample) or had a flank wear width of 0.20 mm was defined as the end of the tool life, and the machining time to reach the end of the tool life was measured. Further, the damage form after the elapse of 10 minutes of machining time and the damage form when the sample reached the end of the tool life were observed with an SEM. It should be noted that the damage form of "chipping" after the elapse of 10 minutes of machining time indicates the occurrence of chipping which allows the machining to be continued. Further, a long machining time indicates excellent fracture resistance and wear resistance. The evaluation results obtained are shown in Tables 9 and 10.

TABLE 9

| Sample No. | Wear test Damage form after elapse of 10 minutes of machining time | Machining time (min) | Damage form |
|---|---|---|---|
| Invention sample 1 | Normal wear | 100 | Normal wear |
| Invention sample 2 | Normal wear | 120 | Normal wear |
| Invention sample 3 | Normal wear | 140 | Normal wear |
| Invention sample 4 | Normal wear | 130 | Normal wear |
| Invention sample 5 | Normal wear | 140 | Normal wear |
| Invention sample 6 | Normal wear | 130 | Normal wear |
| Invention sample 7 | Normal wear | 160 | Normal wear |
| Invention sample 8 | Normal wear | 175 | Normal wear |
| Invention sample 9 | Normal wear | 120 | Normal wear |
| Invention sample 10 | Normal wear | 125 | Normal wear |
| Invention sample 11 | Normal wear | 130 | Normal wear |
| Invention sample 12 | Normal wear | 125 | Normal wear |
| Invention sample 13 | Normal wear | 115 | Normal wear |
| Invention sample 14 | Normal wear | 110 | Normal wear |
| Invention sample 15 | Normal wear | 130 | Normal wear |

TABLE 10

| Sample No. | Wear test Damage form after the elapse of 10 minutes of machining time | Machining time (min) | Damage form |
|---|---|---|---|
| Comparative sample 1 | Chipping | 30 | Fracturing |
| Comparative sample 2 | Normal wear | 80 | Normal wear |
| Comparative sample 3 | Chipping r | 35 | Fracturing |
| Comparative sample 4 | Normal wear | 70 | Normal wear |
| Comparative sample 5 | Chipping | 40 | Fracturing |
| Comparative sample 6 | Normal wear | 30 | Fracturing |
| Comparative sample 7 | Normal wear | 75 | Normal wear |
| Comparative sample 8 | Normal wear | 70 | Normal wear |
| Comparative sample 9 | Chipping | 15 | Fracturing |
| Comparative sample 10 | Normal wear | 25 | Fracturing |

The results of Tables 9 and 10 show that the machining time of each invention sample was 100 minutes or longer, which was longer than the machining time of each comparative sample.

The above results indicate that each invention sample has improved wear resistance and fracture resistance and accordingly has a long tool life.

INDUSTRIAL APPLICABILITY

The coated cutting tool according to the present invention has excellent wear resistance and fracture resistance, whereby the tool life can be extended more than that involved in the prior art, and the coated cutting tool therefore has high industrial applicability.

REFERENCE SIGNS LIST

1: Substrate, 2: First composite nitride layer, 3: Second composite nitride layer, 4: Coating layer, 5: Coated cutting tool.

What is claimed is:
1. A coated cutting tool comprising a substrate and a coating layer formed on the substrate, wherein:
the coating layer includes a first composite nitride layer containing a compound having a composition represented by formula (1) below, and a second composite nitride layer containing a compound having a composition represented by formula (2) below:

(1)

wherein x denotes an atomic ratio of the Al element based on a total of the Al element and the Cr element and satisfies $0.75 \leq x \leq 0.90$; and (2)

wherein y denotes an atomic ratio of the Al element based on a total of the Al element and the Cr element and satisfies $0.75 \leq y \leq 0.90$;

an average particle size of particles which constitute of the first composite nitride layer is less than 100 nm;

the second composite nitride layer comprises a cubic crystal system, and a ratio I(111)/I(200) of a peak intensity I(111) for a (111) plane of the second composite nitride layer to a peak intensity I(200) for a (200) plane of the second composite nitride layer in an X-ray diffraction analysis is 1.0 or more;

an average particle size of particles which constitute of the second composite nitride layer is 100 nm or more; and     a residual stress of the second composite nitride layer is from −10.0 GPa or higher to −2.0 GPa or lower.

2. The coated cutting tool according to claim 1, wherein an average thickness of the first composite nitride layer is from 0.1 μm or more to 1.0 μm or less.

3. The coated cutting tool according to claim 1, wherein an average thickness of the second composite nitride layer is from 0.5 μm or more to 5.0 μm or less.

4. The coated cutting tool according to claim 1, wherein particles which constitute of the second composite nitride layer comprise columnar crystals with an aspect ratio of 2.0 or more.

5. The coated cutting tool according to claim 1, wherein the coating layer has an alternating laminate structure in which the first composite nitride layer and the second composite nitride layer are repeatedly formed twice or more in an alternating manner.

6. The coated cutting tool according to claim 1, wherein an average thickness of the entire coating layer is from 1.0 μm or more to 6.0 μm or less.

7. The coated cutting tool according to claim 1, wherein the substrate is a cemented carbide, cermet, ceramic or a cubic boron nitride sintered body.

8. The coated cutting tool according to claim 2, wherein an average thickness of the second composite nitride layer is from 0.5 μm or more to 5.0 μm or less.

9. The coated cutting tool according to claim 2, wherein particles which constitute of the second composite nitride layer comprise columnar crystals with an aspect ratio of 2.0 or more.

10. The coated cutting tool according to claim 3, wherein particles which constitute of the second composite nitride layer comprise columnar crystals with an aspect ratio of 2.0 or more.

11. The coated cutting tool according to claim 8, wherein particles which constitute of the second composite nitride layer comprise columnar crystals with an aspect ratio of 2.0 or more.

12. The coated cutting tool according to claim 2, wherein the coating layer has an alternating laminate structure in which the first composite nitride layer and the second composite nitride layer are repeatedly formed twice or more in an alternating manner.

13. The coated cutting tool according to claim 3, wherein the coating layer has an alternating laminate structure in which the first composite nitride layer and the second composite nitride layer are repeatedly formed twice or more in an alternating manner.

14. The coated cutting tool according to claim 4, wherein the coating layer has an alternating laminate structure in which the first composite nitride layer and the second composite nitride layer are repeatedly formed twice or more in an alternating manner.

15. The coated cutting tool according to claim 8, wherein the coating layer has an alternating laminate structure in which the first composite nitride layer and the second composite nitride layer are repeatedly formed twice or more in an alternating manner.

16. The coated cutting tool according to claim 9, wherein the coating layer has an alternating laminate structure in which the first composite nitride layer and the second composite nitride layer are repeatedly formed twice or more in an alternating manner.

17. The coated cutting tool according to claim 10, wherein the coating layer has an alternating laminate structure in which the first composite nitride layer and the second composite nitride layer are repeatedly formed twice or more in an alternating manner.

18. The coated cutting tool according to claim 11, wherein the coating layer has an alternating laminate structure in which the first composite nitride layer and the second composite nitride layer are repeatedly formed twice or more in an alternating manner.

19. The coated cutting tool according to claim 2, wherein an average thickness of the entire coating layer is from 1.0 μm or more to 6.0 μm or less.

20. The coated cutting tool according to claim 3, wherein an average thickness of the entire coating layer is from 1.0 μm or more to 6.0 μm or less.

\* \* \* \* \*